United States Patent [19]
Henri

[11] 3,812,406
[45] May 21, 1974

[54] LIGHT EMITTING DIODE DEVICE FOR DISPLAYING CHARACTERS

[75] Inventor: Dominique Henri, Epron, France

[73] Assignee: U.S. Philips Corporation, New York, N.Y.

[22] Filed: June 20, 1973

[21] Appl. No.: 371,718

Related U.S. Application Data

[63] Continuation of Ser. No. 170,144, Aug. 9, 1971, abandoned.

[52] U.S. Cl. ..... 317/235 N, 317/235 R, 317/234 E, 317/234 F

[51] Int. Cl. .......... H01l 15/00

[58] Field of Search......... 317/235 N, 234 E, 234 F, 317/235 R

[56] References Cited

UNITED STATES PATENTS

| | | | |
|---|---|---|---|
| 3,641,390 | 2/1972 | Nakamura | 315/169 |
| 3,501,676 | 3/1970 | Dalmasso | 315/169 |
| 3,594,610 | 7/1971 | Evans | 315/169 |

*Primary Examiner*—Martin H. Edlow
*Attorney, Agent, or Firm*—Simon L. Cohen

[57] ABSTRACT

A light emitting diode display apparatus where a light emitting diode junction is formed on the surface of a semiconductor crystal. Metallized contact faces are formed on the surface of the crystal in direct contact with metal connection surfaces on a transparent insulating support layer to which the crystal is secured.

5 Claims, 4 Drawing Figures

PATENTED MAY 21 1974 3,812,406

SHEET 2 OF 2

LIGHT EMITTING DIODE DEVICE FOR DISPLAYING CHARACTERS

This is a continuation, of application Ser. No. 170,144, filed Aug. 9, 1971, now abandoned.

The present invention relates to a device for displaying characters or alphanumerical letter characters by means of light, said device comprising at least a semiconductor crystal on a surface of which, termed effective surface, at least an electroluminescent diode is present which can be excited by means of an external voltage source and which comprises metallized contact faces at the said effective surface.

Electroluminescent semiconductor elements are often used in groups which form matrices of dots, stripes or various motifs, for example, for displaying alphanumerical letter characters or for realizing optical coding panels, according to an arrangement in rectangular Cartesian coordinates.

When it is desirable to obtain panels of large dimensions, it is necessary to unite a certain number of separate individual elements or a network of integrated or nonintegrated diodes, to secure them on a rigid support and to provide their output connections.

It is known that the overall luminous efficiency of a semiconductor electroluminescent diode depends not only upon the size of the surface area of the emitting junction, but also on the absorption of the emitted radiation between the said junction and the emanating face of the diode. For this reason the said emitting junction preferably lies as close to the emanating face of the device as possible.

Said junction is in general obtained by diffusion, in any epitaxial layer or a substrate of a given conductivity type, of impurities of the opposite conductivity type; this diffusion is never very deep and for this reason the surface of the epitaxial layer or of the substrate which has served as the starting point for the diffusion (and which for this reason is termed effective surface) must lie as close to the emanating face of the device as possible.

Known in addition are the difficulties experienced in the manufacture of contact faces and connections in electroluminescent devices; these contact faces and these connections, if they are large, constitute masks which prevent the emission of luminescent radiation.

So it is necessary to minimize the dimensions of the said contact faces and connections but in that case on the one hand the vulnerability of the resulting devices is considerably increased, and on the other hand the control currents and hence the possibilities of the said devices are restricted.

It is the object of the present invention to mitigate the said drawbacks.

The present invention relates to a device for displaying characters or alphanumerical letter characters by means of light, the device comprising at least a semiconductor crystal at a surface of which, termed effective surface, at least an electroluminescent diode is manufactured which can be excited by means of an external voltage source and is provided at the circumference of the said effective surface with metallized contact faces, characterized in that the crystal is secured, at least with its effective surface, to a transparent insulating support having metal connection surfaces which are directly connected to the metal faces of the said effective surface of the crystal.

In this case, the effective surface of the crystal is in the immediate proximity of the emanating face of the device, which is formed by transparent insulating material of the support, so that the rays can pass through it with a minimum absorption.

The contact connections of the crystal which usually consist of thickenings obtained by metall deposition, are soldered to metallized faces provided on the insulating support, as a result of which the length of the connections is found to be considerably reduced and their rigidity increased, which reduces the vulnerability of the device and avoids power dissipation in the said connections.

The metal connection surfaces of the insulating transparent support preferably constitute two substantially orthogonal networks, which thus define intermediate faces not masked in the said support, and which correspond to the location and the dimensions of the light-emitting junctions of the crystal.

The insulating transparent support preferably is of glass and preferably has the shape of a flat or curved plate or of a plano-convex lens.

The choice of glass involves a double result: on the one hand it permits the free passage of the radiation emitted by the electroluminescent junction or junctions, on the other hand, metal connection surfaces of suitable dimensions and with a good adhesion can be provided at the surface at the correct location. Depositing metal layers on glass has become a conventional operation the performance of which, especially in manufacturing hybrid integrated circuits, is known to those skilled in the art.

The semiconductor crystal or crystals are preferably protected by a lacquer or transparent resin and the assembly of the device is protected by a coating with opaque lacquer with the exception of the surface through which the radiation emanates.

In a first preferred embodiment of the invention, the device comprises a crystal on which a multiple of electroluminescent diodes is manufactured which constitute a character or alphanumerical letter character.

This embodiment may be used, for example, in the case in which an assembly for displaying symbols is to be manufactured which does not comprise an arrangement in lines and/or columns.

In a second preferred embodiment of the invention, the device comprises a multiple of crystals on each of which a multiple of electroluminescent diodes is secured which constitute a character or an $\alpha$-numerical letter character.

This embodiment permits of obtaining an assembly for displaying symbols in lines and/or columns, the number of crystals of which actually is restricted only by the added decoding circuit.

The said decoding circuit which is formed by one or several integrated circuits, is preferably also provided in the device according to the invention.

In order that the invention may be readily carried into effect, it will now be described in greater detail, by way of example, with reference to the accompanying drawing, in which.

It is to be noted that certain dimensions are exaggerated in the Figures so as to make them clearer.

Figure 1:
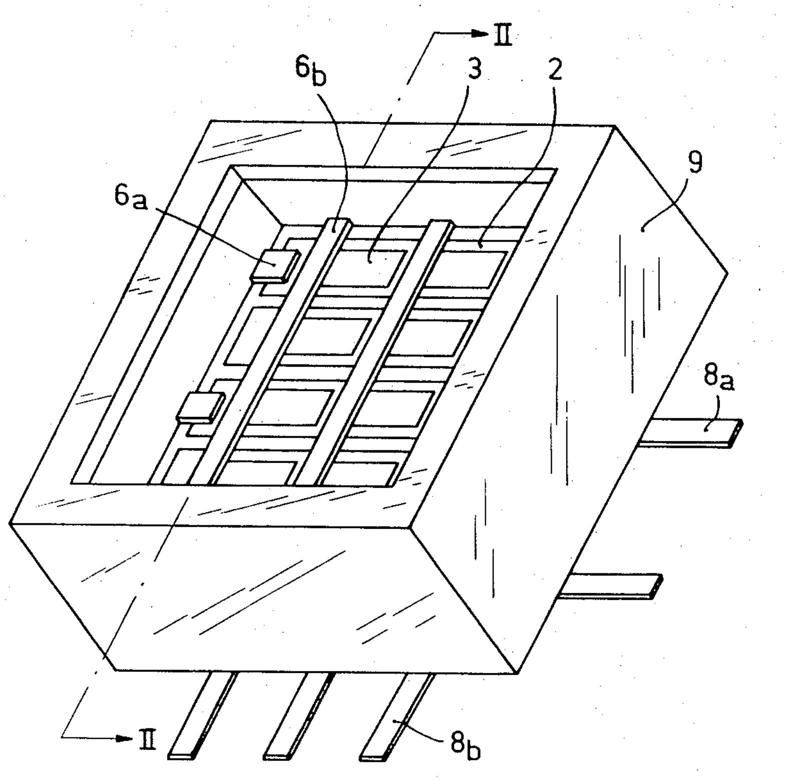
FIG. 1 is a perspective view of a device according to the invention having several electroluminescent diodes which are arranged on the same crystal.
Figure 2:
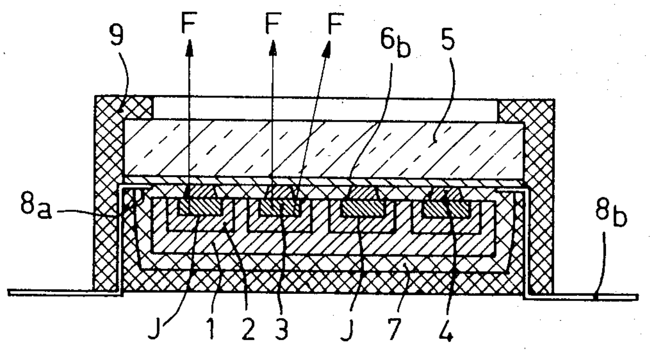
FIG. 2 is a diagrammatic cross-sectional view taken on the line II—II of the same device.

In FIGS. 1 and 2, the actual electroluminescent assembly consists of a plate of an insulating monocrystalline gallium arsenide 1. Strip-shaped parallel islands 2 manufactured from a semiconductor material, for example of gallium arsenide, strongly doped with tellurium or tin, are provided in the plate.

Islands 3, for example of gallium arsenide strongly doped with zinc, are provided in said islands 2. Said islands 3 which are distributed over the strips 2 are arranged in lines and columns.

Metal thickenings 4 are provided on the islands 2 and 3 by vapour deposition.

The electroluminescent assembly thus formed is provided on a transparent insulating support 5 of, for example, glass which comprises metallized faces in such manner that the thickenings 4 corresponding to the islands 2 and 3 of the crystal become located opposite to the metallized faces 6*a* and 6*b*, respectively, of the support 5.

The thickenings 4 of the crystal are then connected to the metal faces 6*a* and 6*b* of the support by thermocompression.

The electroluminescent assembly is then dipped in a transparent lacquer 7, for example, a thermosetting epoxy resin.

After connection strips 8 which at one end show a brace 8*a* and which are secured to metallized faces 6*a* and 6*b* have been connected to the circumference of the support 5, the assembly is enveloped with an opaque lacquer 9 likewise of the epoxy type.

Such a finished device has the advantage of being readily workable and occupying a small space.

During operation, the electroluminescent diodes formed by the islands 2 and 3 are excited by a voltage which is supplied by an external source which is connected to the lugs 8*a* and 8*b*, respectively, which correspond to the metallized faces 6*a* and 6*b*, which are chosen to exite certain diodes.

The radiation emitted at the level of the junction J which is represented by the arrows F emanates at the surface of the device through the transparent support 5.

Figure 3:
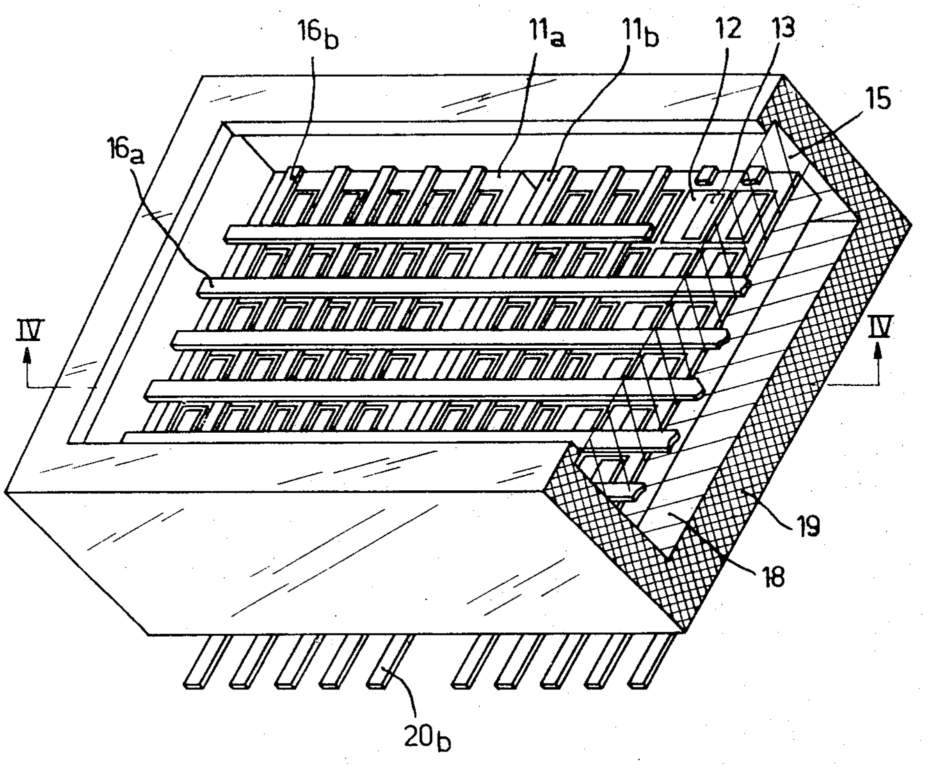
FIG. 3 is a perspective view of a part of a device according to the invention which consists of several semiconductor crystals which each comprise several electroluminescent diodes.
Figure 4:
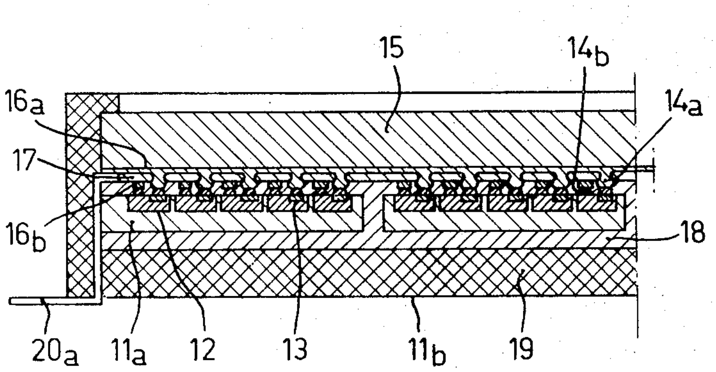
FIG. 4 is a diagrammatic cross-sectional view taken on the line IV—IV of the same device.

In FIGS. 3 and 4, the device comprises a multiple of plates 11*a*, 11*b*, and so on, for example, of insulating monocrystalline gallium arsenide. Parallel islands 12, for example of gallium arsenide, doped with tellurium or tin, are provided in said plates by local epitaxy or diffusion.

Islands 13, for example of gallium arsenide strongly doped with zinc, are provided in said islands 12. These islands 13 are arranged on the plates and in the assembly of said plates in lines and columns.

Metal thickenings 14*a* and 14*b* which are destined for the various contact connections are provided locally on the islands 12 and 13 by vapour deposition in a vacuum.

The electroluminescent assembly thus formed is provided on a transparent insulating support 15, for example of glass, which is provided with metallized faces 16*a*, 16*b*. These metal faces which are arranged opposite to the thickenings 14*a* and 14*b* of the islands 12 and 13 in lines and columns, thus form two networks 16*a* and 16*b* which are arranged perpendicular to each other.

In order to prevent shortcircuits between the two networks, the metallized faces 16*a* are insulated from the faces 16*b* during the manufacture of the support, for example by a layer of silicon. This layer is provided via a mask which leaves apertures in it for the contact between the thickenings 14*a* and the strips 16*a*. The thickenings 14*a* and 14*b* of the various faces are then secured to the metallized faces 16*a* and 16*b* of the support 15*a*, for example, by thermocompression, after which the electroluminescent assembly is dipped in a transparent lacquer 18 and in an opaque lacquer 19.

The dimensions of the metallized faces 16*a* and 16*b* are chosen to be so that the mutually non-coated intermediate spaces correspond to the location and at least the dimensions of the light-emitting junctions formed by the islands 12 and 13.

Connection lugs 20 and 20*b* connected to the metallized faces 16*a* and 16*b*, were previously secured in the same manner as in the preceding example.

The invention may be applied for displaying, by means of light, various indications or results or a data of various computers.

What is claimed is:

1. A display device, comprising an insulating support, a semiconductor body attached to said support, the body having a planar surface remote from the support, the body having a first type conductivity and being provided with a surface region of the opposite conductivity type forming an electroluminescent junction in the body intersecting only said planar surface of the body, separate metallized contact faces attached to said planar surface of the body at both sides of said electroluminescent junction, a transparent insulating covering support, and at least two metal connection surfaces secured to one side of the transparent insulating covering support, each of the metal connection surfaces abutting a corresponding metallized contact face on said planar surface of the body.

2. A device as claimed in claim 1, wherein the metal connection surfaces comprise a first and second set of substantially orthogonal crossed conductors, and wherein the non-metallized portions of the support intermediate the metallized contact faces are adjacent the electroluminescent junction of the diode.

3. A device as claimed in claim 2 further comprising electrically insulating materail separating the two sets of orthogonal conductors at the cross-points thereof.

4. A device as claimed in claim 1, wherein the insulating support comprises a glass material.

5. A device as claimed in claim 1 further comprising a transparent lacquer surrounding the semiconductor crystal, and an opaque lacquer covering all areas of the display device with the exception of a face of the transparent support opposite the electroluminescent diode.

* * * * *

UNITED STATES PATENT OFFICE
CERTIFICATE OF CORRECTION

Patent No. 3,812,406 Dated May 21, 1974

Inventor(s) Dominique Henri

It is certified that error appears in the above-identified patent and that said Letters Patent are hereby corrected as shown below:

Col. 1, line 34, "any" should be -- an --.

Signed and sealed this 22nd day of April 1975.

(SEAL)
Attest:

RUTH C. MASON
Attesting Officer

C. MARSHALL DANN
Commissioner of Patents
and Trademarks